(12) United States Patent
Fitting et al.

(10) Patent No.: US 7,501,860 B2
(45) Date of Patent: Mar. 10, 2009

(54) DIFFERENTIAL INPUT DRIVER USING CURRENT FEEDBACK AND CROSS-COUPLED COMMON BASE DEVICES

(75) Inventors: Andrew Fitting, Sunnyvale, CA (US); Michael Maida, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/949,333

(22) Filed: Dec. 3, 2007

(65) Prior Publication Data
US 2009/0033421 A1 Feb. 5, 2009

Related U.S. Application Data

(60) Provisional application No. 60/953,166, filed on Jul. 31, 2007.

(51) Int. Cl.
*H03K 19/094* (2006.01)
*H03K 19/0175* (2006.01)
(52) U.S. Cl. .................. 326/84; 326/115; 326/127; 330/102; 330/253
(58) Field of Classification Search .......... 326/80–84, 326/112, 115, 124, 126–127; 330/102, 253
See application file for complete search history.

(56) References Cited

U.S. PATENT DOCUMENTS 4,885,548 A * 12/1989 Wakimoto et al. .......... 330/260
5,250,911 A * 10/1993 Linder et al. ............... 330/149
6,437,599 B1 * 8/2002 Groen ........................ 326/63
7,215,194 B2 * 5/2007 Kucharski et al. .......... 330/252
2005/0162229 A1 * 7/2005 Notthoff .................... 330/252

OTHER PUBLICATIONS

Taewon Jung, "Design Of A 570MHz Current Feedback Amplifier On Bonded Wafer Technology," Harris Semiconductor article, pp. 396-399, NPL date unknown.

* cited by examiner

*Primary Examiner*—Rexford Barnie
*Assistant Examiner*—Jason Crawford
(74) *Attorney, Agent, or Firm*—Patent Law Group LLP; Carmen C. Cook

(57) ABSTRACT

A differential input driver circuit (10, 50) includes first and second transistors (Q0, Q3) as input transistors and third and fourth transistors (Q1, Q2) as diode-connected, cross-coupled transistors. In one embodiment, first, second, third and fourth transistors are NPN bipolar transistors. The base terminals of the first and third transistors are connected while the base terminals of the second and fourth transistors are connected. The input transistors receive a pair of differential input signals (In+/−) at the emitter terminals (24, 26) and provides a pair of differential output signals (Vo+/−) at the collector terminals (16, 18). The emitter terminals of the diode-connected transistors (Q1, Q2) couple the input signal at the emitter terminal of the first transistor to the collector terminal of the second transistor and vice versa. The cross-coupling of the third and fourth transistors enables the input driver to operate effectively in single-ended to differential conversion mode.

16 Claims, 3 Drawing Sheets

DIFFERENTIAL INPUT DRIVER USING CURRENT FEEDBACK AND CROSS-COUPLED COMMON BASE DEVICES

CROSS-REFERENCE TO RELATED APPLICATION

This application claims the benefit of U.S. Provisional Patent Application Ser. No. 60/953,166, filed on Jul. 31, 2007, having the same inventorship hereof, which application is incorporated herein by reference in its entirety.

FIELD OF THE INVENTION

The invention relates to differential amplifiers and, in particular, to a differential amplifier for use as an input driver for a data converter and incorporating current feedback and cross-coupled common base devices.

DESCRIPTION OF THE RELATED ART

High performance data converters, such as analog-to-digital converters (ADC's), are used to sample and capture analog signals at high precision and at fast sampling rates. High performance data converters typically have strict input conditions in order to achieve the ultimate performance expected from the data converters. Thus, the scaling, driving, and interfacing of the analog signals to a high performance ADC remain a challenging task.

An effective input driver for a data converter is critical to maintain signal integrity. Techniques for interfacing and driving analog signals to high speed data converters are known but conventional techniques have many shortcomings. For example, most ADCs use differential inputs while the analog input signal may be a single-ended signal only. The input driver must thus be able to support single-ended to differential conversion. Conventional input driver circuits for single-ended to differential conversion, such as baluns or transformers, suffer from performance limitations as most cannot work in DC or low frequency range.

Known differential input driver circuits include the conventional differential pair. FIG. 1 illustrates an exemplary NPN bipolar differential pair. NMOS differential pair can also be formed using a pair of NMOS transistors in place of the NPN bipolar transistors. Alternately, the conventional differential pairs can be formed using P-type bipolar or MOS transistors. The conventional differential pair uses voltage feedback and uses only one gender of transistors—N-type or P-type. When N-type devices are used, the input signals cannot get close to the lower power rail (e.g., ground). On the other hand, when P-type devices are used, the input signals cannot get close to the upper power rail (e.g. Vdd).

Improvements over the classic differential pair of FIG. 1 include using current feedback. An exemplary current feedback amplifier is described in a paper by Taewon Jung, "Design of A 570 MHz Current Feedback Amplifier On Bonded Wafer Technology," Southcon conference proceedings, pp. 396-399, June 1996. The conventional current feedback amplifiers, such as the current feedback amplifier of Jung, require both N and P types of transistors (NPN and PNP transistors). Also, the input voltage of the conventional current feedback amplifiers cannot get close to the lower power rail (ground) or the higher power rail (Vdd).

DETAILED DESCRIPTION OF THE PREFERRED EMBODIMENTS

In accordance with the principles of the present invention, a differential input driver circuit includes a pair of common base input transistors receiving a pair of differential input signals and generating a pair of differential output signals using current feedback. The differential input driver circuit also includes a pair of cross-coupled level shifting diodes. In one embodiment, the level shifting diodes are cross-coupled transistors, allowing the input driver to be operated as a fully differential driver or as a single-ended to differential converter.

A salient feature of the differential input driver circuit of the present invention is that the differential input driver circuit is implemented using transistors of only one polarity type, that is, either N-type transistors or P-type transistors. In one embodiment, the differential input driver circuit is implemented using only NPN bipolar transistors. In an alternate embodiment, the differential input driver circuit is implemented using only PNP bipolar transistors. The differential input driver circuit of the present invention employs current feedback. Therefore, the input voltage range can extend to the lower power rail (ground) when N-type devices are used and extend to the upper power rail (Vdd) when P-type devices are used. These input voltage ranges are more useful in practice than the input voltage ranges afforded by the conventional differential pairs. Conventional N-type differential pairs limit the input voltage to the lower power rail and are thus not desirable for low voltage input signals. The input driver circuit of the present invention does not limit the voltage near the lower power rail and is therefore useful in applications involving small voltage values.

The differential input driver circuit of the present invention is particularly useful when fabricated using fabrication processes that provides transistors of only one polarity type. For instance, in some fabrication processes, only fast NPN bipolar transistors are provided without any PNP bipolar transistor. The differential input driver circuit of the present invention can be implemented using only NPN bipolar transistors and the input voltage range can still reach close to the lower power rail (ground). Conventional differential input drivers require use of complimentary bipolar process and thus cannot be manufactured in fabrication processes that provide transistors of only one polarity type.

Figure 1:
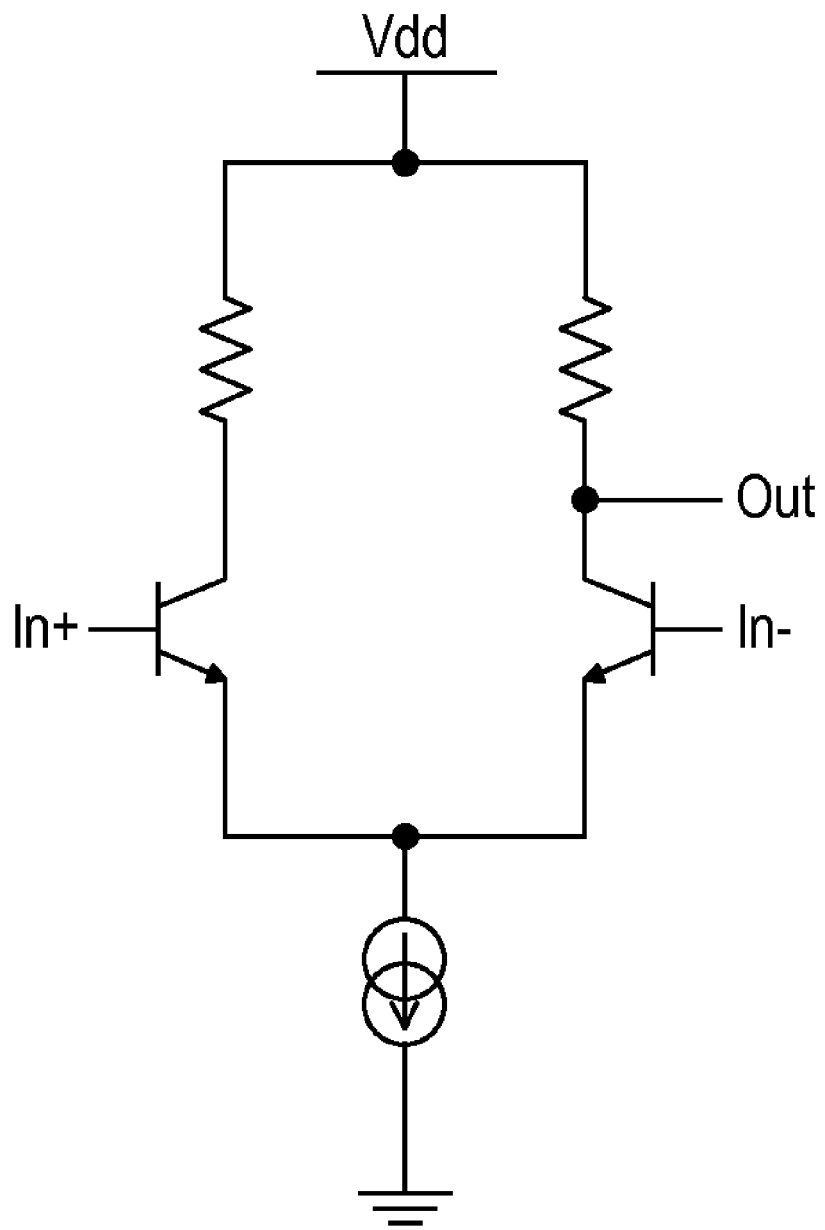
FIG. 1 is circuit diagram of a conventional NPN differential pair.
Figure 2:
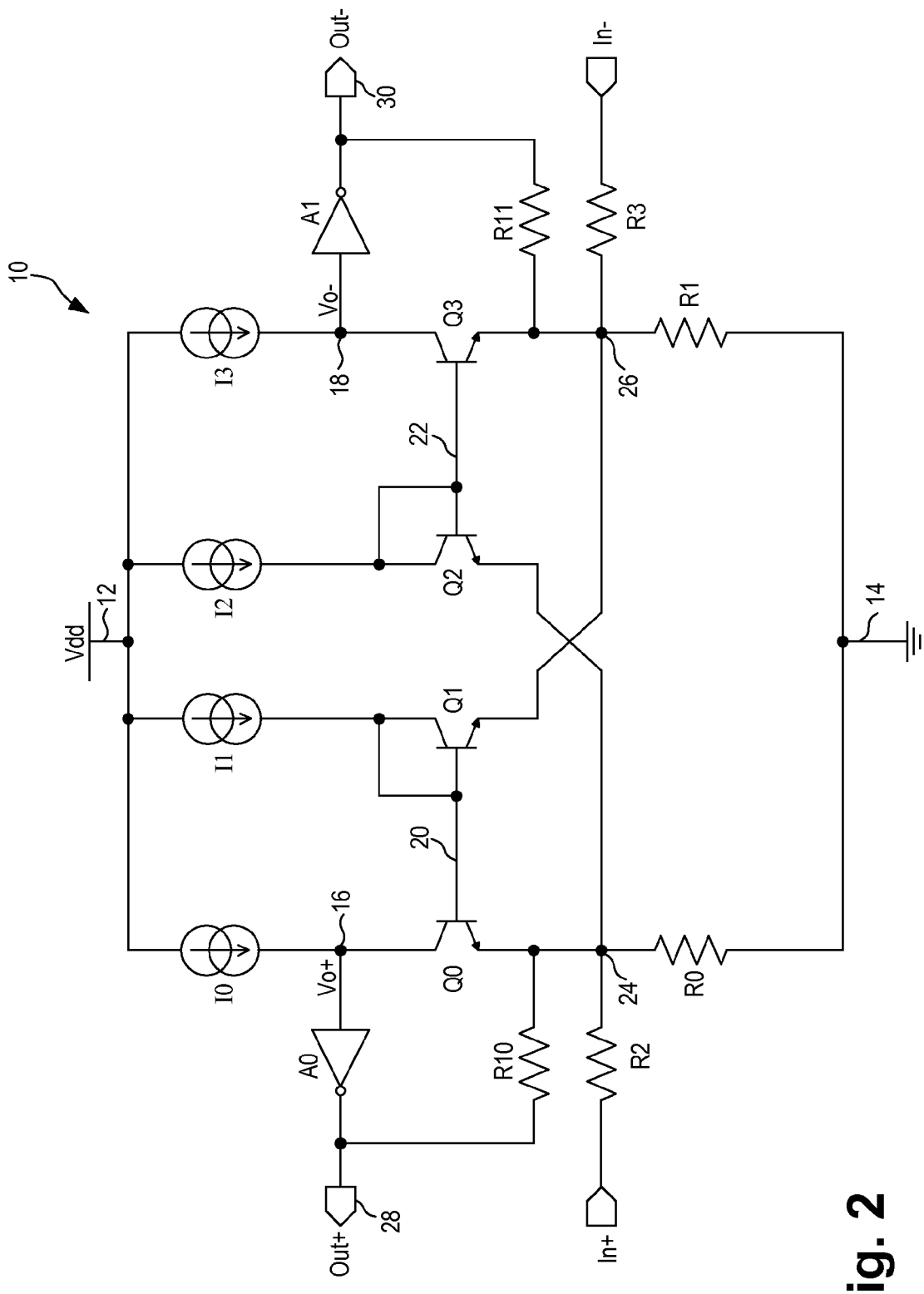
FIG. 2 is a circuit diagram of a differential input driver circuit using only NPN bipolar transistors according to one embodiment of the present invention.

FIG. 2 is a circuit diagram of a differential input driver circuit using only NPN bipolar transistors according to one embodiment of the present invention. Referring to FIG. 2, differential input driver circuit 10 ("input driver 10") includes a pair of common base input transistors Q0 and Q3 and a pair of cross-coupled level shifting diodes implemented as transistors Q1 and Q2. Transistors Q0, Q1, Q2 and Q3 are biased by respective current sources I0, I1, I2 and I3. Current sources I0, I1, I2 and I3 are coupled between the positive power supply voltage Vdd and the collector terminals of respective transistors Q0, Q1, Q2 and Q3.

In the present embodiment, transistors Q0, Q1, Q2 and Q3 are NPN bipolar transistors. Input driver 10 can be implemented using only NPN bipolar transistors while still allowing input voltage range down to the lower power rail (ground). Input driver 10 does not require any PNP bipolar transistors for its implementation.

More specifically, differential input signals In+ and In−, in the form of input currents, are coupled to the emitter terminals (nodes 24, 26 respectively) of respective input transistors Q0 and Q3 through respective input resistors R2 and R3. Resistors R0 and R1 serve as DC current sources at the emitter terminals of the input transistors. Resistors R0 and R1 have the same resistance values and are connected between the emitter terminals (nodes 24, 26) of the respective input transistors Q0 and Q3 and the ground voltage (node 14). The collector terminals (nodes 16, 18) of input transistors Q0 and Q3 provide the output signals Vo+ and Vo− of input driver 10. The output signals Vo+ and Vo− are amplified by respective amplifiers A0 and A1 to generate the output signals Out+ and Out− at output terminals 28, 30. Output signals Vo+ and Vo− are essentially the same as output signals Out+ and Out− except for the amplification and voltage polarity inversion, if any, provided by amplifiers A0 and A1.

The input currents indicative of input signals In+ and In− travel from the input terminals (nodes 24, 26) to the output terminals (nodes 28, 30) as output signals Out+ and Out−, buffered and amplified by the input transistors Q0 and Q3. That is, NPN transistor Q0 buffers current from the In+ terminal (node 24) to the Out+ terminal (node 28) and NPN transistor Q3 buffers current from the In− terminal (node 26) to the Out− terminal (node 30).

The base terminals of input transistors Q0 and Q3 are connected to the base terminals of respective diode-connected transistors Q1 and Q2. Diode-connected transistors Q1 and Q2 are cross-coupled so that the emitter terminals of transistors Q1 and Q2, each associated with transistors Q0 and Q3, are connected to the input terminals of the other input transistor Q3 and Q0. More specifically, NPN bipolar transistor Q1 is associated with input transistor Q0 and has its base and collected terminals shorted together and connected to the base terminal of transistor Q0 (node 20). The emitter terminal of transistor Q1 is connected to the emitter terminal of the other input transistor Q3 (node 26) which is also the input terminal for input signal In−. On the other hand, NPN bipolar transistor Q2 is associated with input transistor Q3 and has its base and collected terminals shorted together and connected to the base terminal of transistor Q3 (node 22). The emitter terminal of transistor Q2 is connected to the emitter terminal of the other input transistor Q0 (node 24) which is also the input terminal for input signal In+. The cross coupled connection is thus established.

As thus configured, the voltage at the base terminal of input transistor Q0 is held one diode voltage above the voltage of input signal In−. Similarly, the voltage at the base terminal of input transistor Q3 is held one diode voltage above the voltage of input signal In+. In input driver 10, the base voltages of input transistors are thus not fixed but vary with the input common mode voltage. In this manner, the input common mode voltage range for input signals In+ and In− is extended. If the base voltages of input transistors Q0 and Q3 are set at a fixed bias voltage, the input common mode range will be limited and when the input voltage exceeds the common mode range, the input driver will go into saturation and cease functioning. In accordance with the present invention, the base voltages of the input transistors are driven from the input signals. Accordingly, the input driver can operate over a wider range of common mode voltages and input common mode suppression is also enhanced. Input driver 10 is thus capable of realizing effective single-ended to differential conversion since input common mode is suppressed.

Cross-coupled diode-connected transistors Q1 and Q2 also serve the function of enabling effective single-ended to differential conversion in input driver 10. Specifically, transistor Q1 transfers the input signal In− to the output signal Out+ via the base of transistor Q0 while transistor Q2 transfers the input signal In+ to the output signal Out− via the base of transistor Q3. Thus, when only one input signal of input driver 10 varies, both output signals will vary in response to realize signal-ended input to differential output conversion.

In the present embodiment, input driver 10 is configured in current feedback through amplifiers A0, A1 and resistors R10 and R11. More specifically, amplifier A0 is coupled to receive the output signal Vo+ (node 16) and the output signal of amplifier A0 (Out+) is fed back to input node 24 through a feedback resistor R10, forming the current feedback loop. Amplifier A1 is coupled to receive the output signal Vo− (node 18) and the output signal of amplifier A1 (Out−) is fed back to input node 26 through a feedback resistor R11, forming the current feedback loop. In the present embodiment, amplifiers A0 and A1 are inverting buffers. The input nodes 24, 26 are low impedance because of the impedances of the emitter terminals of transistors Q0 and Q3. Consequently, the feedback to the input nodes from the amplifiers and the resistors is a current. These feedback currents are summed with the input currents provided through R2 and R3. Resistors R2 and R3 essentially serve as voltage to current converters.

FIG. 2 illustrates one configuration for implementing current feedback in input driver 10 of the present invention. The current feedback configuration shown in FIG. 2 is illustrative only and is not intended to be limiting. Other current feedback configurations can be used in the input driver circuit of the present invention to provide the feedback current. Alternately, input driver 10 can be operated without the current feedback circuit. In that case, the gain of input driver 10 will be open loop instead of closed loop in the case when current feedback is used. The use of current feedback in input driver 10 is thus optional.

Differential input driver circuit 10, as thus configured, realizes many advantages over conventional input drivers. First, by employing current feedback, the input driver of the present invention has improved slew performance in comparison to voltage feedback amplifiers. Furthermore, the common mode voltage range of the input driver is extended because current feedback allows the input voltages to be extended close to the power rails without the need to use transistors of the opposite polarities.

Second, by using cross-coupled diode-connected transistors Q1 and Q2 to bias the base voltages of the input transistors Q0 and Q3, the input common mode voltage range of the input driver is extended. More importantly, the input driver can operate effectively to allow single-end to differential conversion. The differential input driver circuit of the present invention has applications as the input signal drivers for data converters such as high speed analog-to-digital converters. The input driver of the present invention realizes single-ended to differential conversion in a wide frequency range, include DC and low frequencies. In one embodiment, the input driver of the present invention supports single-ended to differential conversion in a frequency range from DC all the way up to 1.2 GHz. Accordingly, the full signal spectrum of the input signal can be acquired over a wide common mode voltage range.

Figure 3:
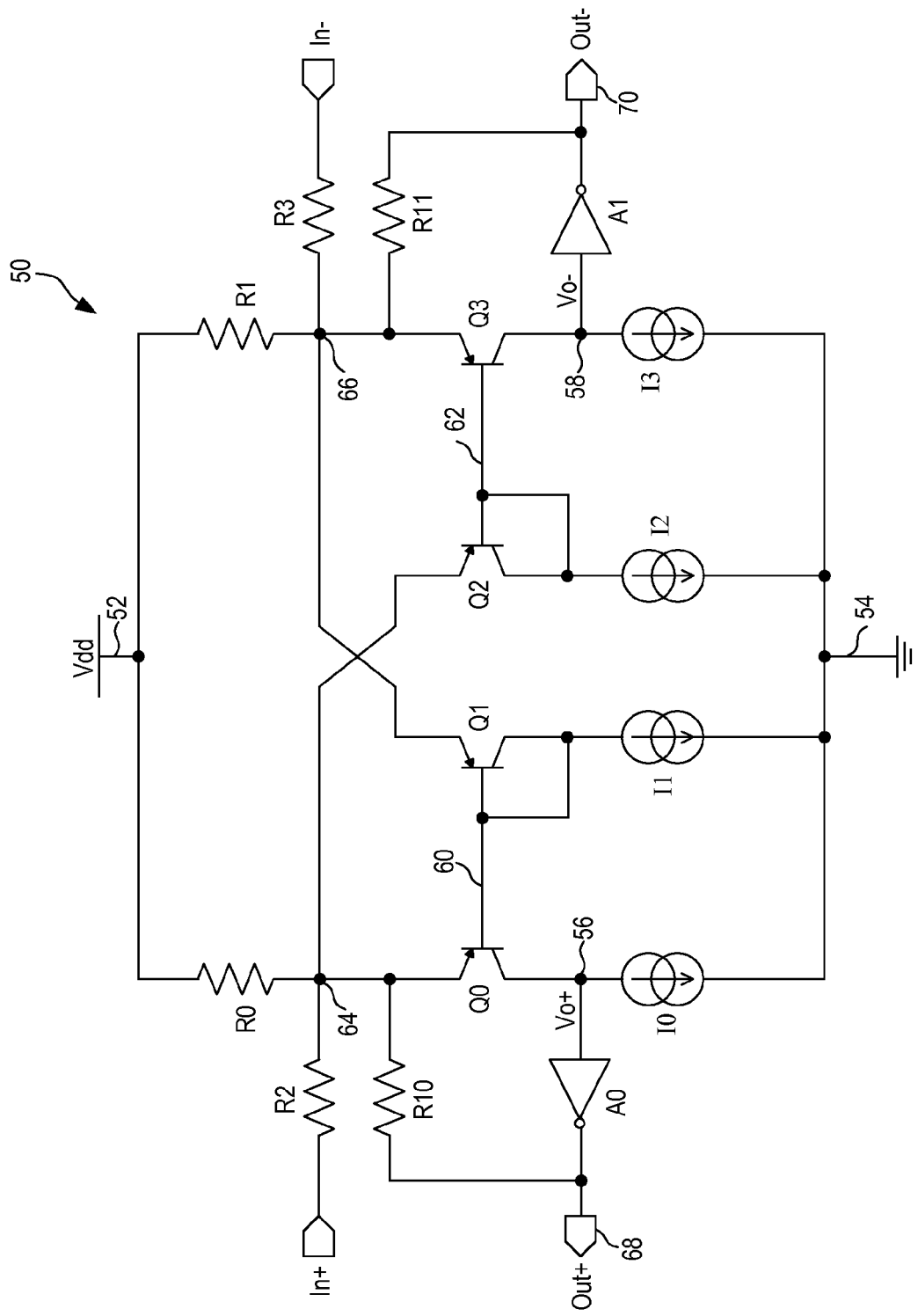
FIG. 3 is a circuit diagram of a differential input driver circuit using only PNP bipolar transistors according to one embodiment of the present invention.

In the above described embodiment, differential input driver circuit 10 is implemented using NPN bipolar transistors. In other embodiments, the differential input driver circuit of the present invention is implemented using PNP bipolar transistors with the voltage polarities of the circuit modified accordingly, as shown in FIG. 3. The differential input driver circuit of the present invention is implemented using transistors of one polarity type only and can be implemented using NPN transistors alone or PNP transistors alone.

In other embodiments, the differential input driver circuit is implemented using MOS transistors. In that case, NMOS transistors can replace the NPN bipolar transistors in FIG. 2 to realize an all NMOS implementation. Alternately, PMOS transistors can replace the PNP bipolar transistors in FIG. 3 to realize an all PMOS implementation.

The above detailed descriptions are provided to illustrate specific embodiments of the present invention and are not intended to be limiting. Numerous modifications and variations within the scope of the present invention are possible. The present invention is defined by the appended claims.

We claim:

1. A differential input driver circuit (10, 50) comprising:
    a first transistor (Q0) having a first current handling terminal (24, 64) coupled to receive a first differential input signal (In+), a second current handling terminal (16, 56) coupled to receive a first current (I0) and a control terminal (20, 60), the second current handling terminal providing a first differential output signal (Vo+);
    a first resistor (R0) coupled between the first current handling terminal (24, 64) of the first transistor and a first power supply voltage (14, 52);
    a second transistor (Q3) having a first current handling terminal (26, 66) coupled to receive a second differential input signal (In−), a second current handling terminal (18, 58) coupled to receive a second current (I3) and a control terminal (22, 62), the second current handling terminal providing a second differential output signal (Vo−);
    a second resistor (R1) coupled between the first current handling terminal (26, 66) of the second transistor and the first power supply voltage;
    a third transistor (Q1) having a first current handling terminal coupled to the first current handling terminal (26, 66) of the second transistor (Q3), and a control terminal connected to the second current handling terminal (20, 60) and to the control terminal of the first transistor and receiving a third current (I1);
    a fourth transistor (Q2) having a first current handling terminal coupled to the first current handling terminal (24, 64) of the first transistor, and a control terminal connected to the second current handling terminal (22, 62) and to the control terminal of the second transistor and receiving a fourth current (I2),
    wherein the first, second, third and fourth transistors are all of a first polarity type.

2. The differential input driver circuit of claim 1, wherein a first input current indicative of the first input signal is buffered by the first transistor to be provided as the first differential output signal, the first input current also being coupled through the fourth transistor to the second differential output signal.

3. The differential input driver circuit of claim 2, wherein a second input current indicative of the second input signal is buffered by the second transistor to be provided as the second differential output signal, the second input current also being coupled through the third transistor to the first differential output signal.

4. The differential input driver circuit of claim 3, further comprising a first resistor (R2) coupled to receive the first differential input signal and generate the first input current and a second resistor (R3) coupled to receive the second differential input signal and generate the second input current.

5. The differential input driver circuit of claim 1, wherein the first, second, third and fourth transistors comprise bipolar transistors, the first current handling terminals comprise the emitter terminals, the second current handling terminals comprise the collector terminals and the control terminals comprises the base terminals.

6. The differential input driver circuit (10) of claim 5, wherein the first, second, third and fourth transistors comprise NPN bipolar transistors and the first power supply voltage comprises the ground voltage.

7. The differential input driver circuit of claim 6, wherein the first, second, third and fourth currents are provided by respective first, second, third and fourth current sources, each of the current sources being coupled between a second power supply voltage (12) and the second current handling terminal of the respective transistor.

8. The differential input driver circuit of claim 7, wherein the second power supply voltage (12) comprises the positive power supply voltage.

9. The differential input driver circuit (50) of claim 5, wherein the first, second, third and fourth transistors comprise PNP bipolar transistors and the first power supply voltage comprises the positive power supply voltage.

10. The differential input driver circuit of claim 9, wherein the first, second, third and fourth currents are provided by respective first, second, third and fourth current sources, each of the current sources being coupled between a second power supply voltage (54) and the second current handling terminal of the respective transistor.

11. The differential input driver circuit of claim 10, wherein the second power supply voltage comprises the ground voltage.

12. The differential input driver circuit of claim 1, wherein the first, second, third and fourth transistors comprise MOS transistors, the first current handling terminals comprise the source terminals, the second current handling terminals comprise the drain terminals and the control terminals comprises the gate terminals.

13. The differential input driver circuit of claim 12, wherein the first, second, third and fourth transistors comprise NMOS transistors and the first power supply voltage comprises the ground voltage.

14. The differential input driver circuit of claim 12, wherein the first, second, third and fourth transistors comprise PMOS transistors and the first power supply voltage is the positive power supply voltage.

15. The differential input driver circuit of claim 1, further comprising:
    a first amplifier (A0) having an input terminal coupled to the second current handling terminal (16, 56) of the first transistor (Q0) and an output terminal (28, 68) providing a first output signal (Out+) indicative of the first differential output signal;
    a third resistor (R10) coupled between the output terminal (28, 68) of the first amplifier and the first current handling terminal (24, 64) of the first transistor, the third resistor and the first amplifier forming a first current feedback loop providing a first feedback current to the first current handling terminal (24, 64) of the first transistor;
    a second amplifier (A1) having an input terminal coupled to the second current handling terminal (18, 58) of the second transistor (Q3) and an output terminal (30, 70) providing a second output signal (Out−) indicative of the second differential output signal; and
    a fourth resistor (R11) coupled between the output terminal (30, 70) of the second amplifier and the first current handling terminal (26, 66) of the second transistor, the fourth resistor and the second amplifier forming a second current feedback loop providing a second feedback current to the first current handling terminal (26, 66) of the second transistor.

16. The differential input driver circuit of claim 15, wherein the first and second amplifiers each comprises an inverting buffer.

* * * * *